(12) United States Patent
Shimoda et al.

(10) Patent No.: US 7,332,673 B2
(45) Date of Patent: Feb. 19, 2008

(54) BUS BAR SUBSTRATE FOR VEHICLE INTERIOR LIGHT

(75) Inventors: Yuji Shimoda, Kawagoe (JP); Hiroshi Ochiai, Kawagoe (JP)

(73) Assignee: Kabushiki Kaisha T AN T, Kawagoe-Shi (JP)

( * ) Notice: Subject to any disclaimer, the term of this patent is extended or adjusted under 35 U.S.C. 154(b) by 211 days.

(21) Appl. No.: 11/005,298

(22) Filed: Dec. 7, 2004

(65) Prior Publication Data
US 2005/0136708 A1    Jun. 23, 2005

(30) Foreign Application Priority Data
Dec. 22, 2003   (JP)   ............................. 2003-425312

(51) Int. Cl.
*H05K 5/00* (2006.01)
(52) U.S. Cl. ...................... 174/68.2; 439/76.2; 439/180
(58) Field of Classification Search .............. 174/68.2; 439/76.2, 180, 213, 36, 720
See application file for complete search history.

(56) References Cited

U.S. PATENT DOCUMENTS

| 4,002,388 | A | * | 1/1977 | Menocal ...................... 439/884 |
| 6,273,593 | B1 | | 8/2001 | Yabata et al. | |
| 6,402,570 | B2 | * | 6/2002 | Soga et al. .................. 439/736 |
| 6,624,354 | B1 | * | 9/2003 | Martinez ...................... 174/50 |

FOREIGN PATENT DOCUMENTS

| JP | 63-45923 | 3/1998 |
| JP | 2000-344010 | 12/2000 |
| JP | 2001-180372 | 3/2001 |

* cited by examiner

*Primary Examiner*—Jinhee Lee
(74) *Attorney, Agent, or Firm*—Nixon & Vanderhye P.C.

(57) ABSTRACT

A bus bar substrate for an interior light of a vehicle includes an insulating base plate and a plurality of bus bars. Grooves are formed in the front and back surfaces of the insulating base plate. The plurality of bus bars are fitted to the grooves of the insulating base plate. In preferred embodiments, a bus bar substrate for an interior light of a vehicle will include front and back surfaces and a plurality of front and back securing holes through the insulating base, and front and back bus bars respectively positioned on the front and back surfaces of the insulating base plate. The front securing holes are surrounded by guard walls extending outwardly from the back surface of the insulating plate, and the back securing holes are surrounded by guard walls extending outwardly from the front surface of the insulating plate. The front and back bus bars comprise front and back stopper portions inserted into respective ones of the front and back securing holes oppositely to one another so as to secure the front and back bus bars to the front and back surfaces of the insulating base plate.

5 Claims, 8 Drawing Sheets

BUS BAR SUBSTRATE FOR VEHICLE INTERIOR LIGHT

BACKGROUND OF THE INVENTION

1. Field of the Invention

The present invention relates to a bus bar substrate for an interior light of a vehicle. The bus bar substrate is installed in an interior light mounted to the inner side of a roof of the vehicle. A bus bar is mounted to the bus bar substrate in order to supply power to a lamp when a switch is operated, such as when a door is opened.

2. Description of the Related Art

A related circuit for turning on a lamp in an interior light of a vehicle comprises bus bars (used for connecting a power supply, a switch, and the lamp) fitted to grooves disposed in the back surface of a base formed by injection molding. Such a circuit is disclosed in, for example, U.S. Pat. No. 6,402,570 (the entire content of which is expressly incorporated hereinto by reference). Switching on the switch causes the power supply and the lamp, disposed in the base, to be connected by the bus bar, thereby turning on the lamp.

In the interior vehicle light as described above, the circuit is a simple circuit used only for turning on and off the lamp in the base. Therefore, it is possible to form the circuit only by using the bus bar in the back surface of the base. An increasing number of recent vans have interior lights for each of three rows of seats, that is, a front seat (driver's seat), a rear seat, and an intermediate seat disposed between the front seat and the rear seat. There is a therefore a demand for separately controlling the flashing of the interior lights at the rear seat and at the intermediate seat by operating a switch installed at the interior light at the driver's seat.

In order to separately control the interior lights at the three rows of seats, a sophisticated circuit is formed. Therefore, when bus bars are disposed only at the back surface of the base, unless the bus bars are crossed, it becomes impossible to construct a circuit network for controlling the flashing of the lamps or it becomes very difficult to design a circuit pattern.

SUMMARY OF THE INVENTION

The present invention is achieved to overcome the aforementioned problems. Its object is to provide a bus bar substrate for an interior light of a vehicle. Bus bars are disposed at a base plate accommodated in a base. A connector terminal is disposed for connecting switches and lamps and interior lights for an intermediate seat and a rear seat by using the bus bars. Such an arrangement makes it possible to control a plurality of interior lights, requiring a sophisticated circuit network, at one location.

To this end, according to a first aspect of the present invention, there is provided a bus bar substrate for an interior light of a vehicle. The bus bar substrate comprises an insulating base plate having grooves in the front and back surfaces thereof, and bus bars fitted to the grooves of the insulating base plate.

According to another aspect of the present invention, there is provided a bus bar substrate for an interior light of a vehicle. The bus bar substrate comprises an insulating base plate having a plurality of securing holes, and bus bars having stopper portions for fitting to the securing holes of the insulating base plate. The bus bars are secured to the front and back surfaces of the insulating base plate via the securing holes.

According to a preferred embodiment, the bus bars have stopper portions disposed at predetermined locations thereof, and the insulating base plate has securing holes for receiving the stopper portions.

Preferably, ends of the stopper portions of the bus bars have bulges that are pushed into walls defining the securing holes so as not to become dislodged therefrom.

An end of a predetermined one of the bus bars fitted to both surfaces of the insulating base plate may be fabricated so as to extend out to a connector box of the insulating base plate and is defined as a connector terminal.

The bus bars to be secured to the front and back surfaces of the insulating base plate may have portions that are connected by bridges so that each bus bar is one unsevered member. Thus, after securing the bus bars to the insulating base plate, each bridge may be severed at a small hole disposed in the insulating base plate in correspondence with the location of its associated bridge, so that a circuit is formed.

Predetermined ones of the bridges of the bus bars secured to the front and back surfaces of the insulating base plate may overlap in the same small hole, and are therefore adapted to being severed at the same small hole in order to electrically connect the bus bars.

As mentioned above, according to the present invention, securing the bus bars to the front and back surfaces of the insulating base plate makes it possible to form a sophisticated circuit without crossing the bus bars. Therefore, it is possible to prevent short-circuit accidents caused by the crossed bus bars.

Fitting the stopper portions of the bus bars to the securing holes formed in the insulating base plate makes it possible to reliably secure the bus bars and the insulating base plate. In addition, the bulge at the end of each stopper portion is pushed into the wall surface defining each securing hole so as not to become dislodged from the corresponding securing hole. Therefore, it is possible to more reliably secure the bus bars and the insulating base plate.

An end of the bus bar is inserted into the connector box of the insulating base plate and is defined as a connector terminal. This connector terminal makes it possible to electrically connect to other interior lights. Therefore, it is possible to control the flashing of a plurality of interior lights by one interior light.

After securing the bus bars, used to form a circuit pattern, to the insulating base plate while their portions are connected by bridges, it is possible to sever the bridges in order to form the circuit pattern. Therefore, it is possible to simplify the mounting operation of the bus bars to the insulating base plate.

By severing the bridges of the bus bars secured to the front and back surfaces of the insulating base plate in the same small hole formed in the insulating base plate, and by integrally forming these severed portions, it is possible to electrically connect the bus bars used to form the circuit pattern. Therefore, this structure is effective in, for example, simplifying the designing of the circuit.

BRIEF DESCRIPTION OF THE DRAWINGS

Reference will be made to the accompanying drawings wherein like reference numerals throughout the various Figures denote like structural elements, and wherein.

DESCRIPTION OF THE PREFERRED EMBODIMENTS

A bus bar substrate for an interior light of a vehicle according to the present invention comprises an insulating base plate having grooves formed in the front and back surfaces and bus bars fitted to the grooves of the insulating base plate.

A. First Embodiment

A bus bar substrate for an interior light of a vehicle according to a first embodiment of the present invention will be described with reference to FIGS. 1 to 4.

Figure 1:
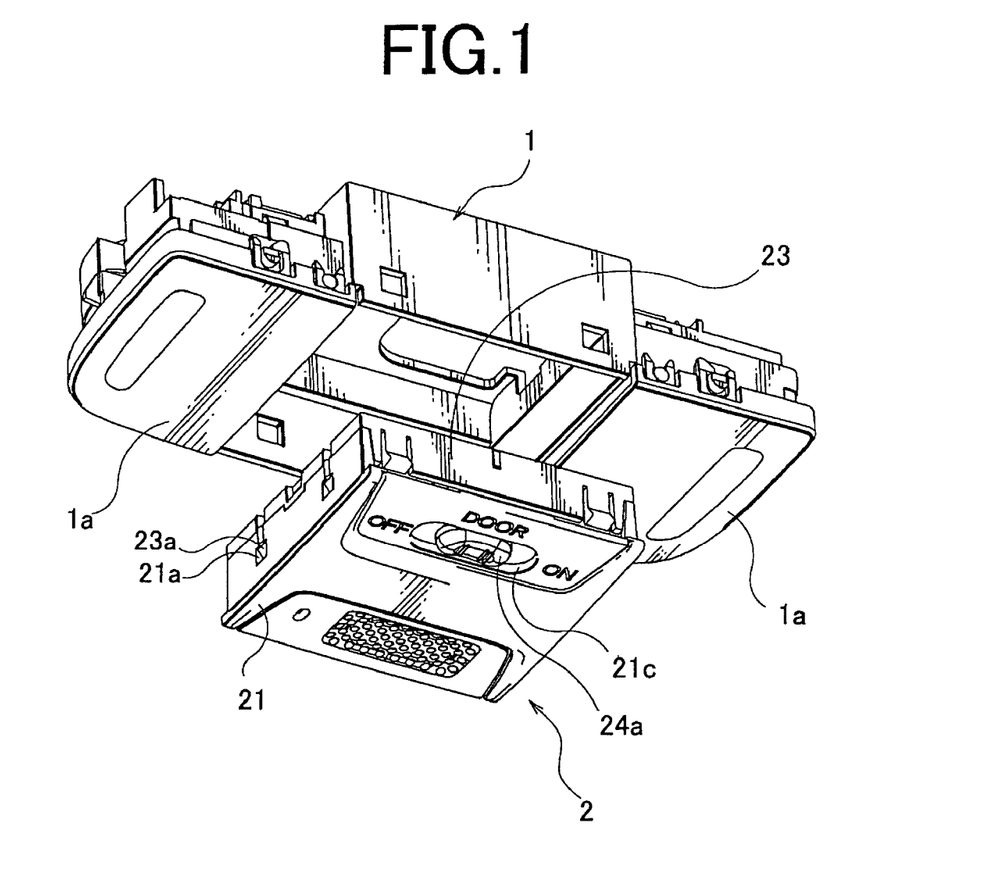
FIG. 1 is an exploded perspective view of a vehicle interior light having a bus bar substrate incorporated therein in accordance with the present invention.

FIG. 1 shows an entire vehicle illuminating light. In this regard, reference numeral 1 denotes a box-shaped base that is formed by, for example, injection molding, and that is divided into three chambers along the longitudinal direction. The left and right chambers accommodate lamps and push switches. Lens plates 1a are rotatably supported at shafts in a cantilever manner towards the center of the base.

Pressing the lens plates 1a at sides opposite to the supporting points of the lens plates 1a causes the push switches to be turn on, causing the lamps to turn on. Pressing the lens plates 1a again causes the push switches to be turned off, causing the lamps to turn off. Such a structure of an in-vehicle interior light device is commonly known and is disclosed in, for example, U.S. Pat. No. 6,273,593, the entire content of which is expressly incorporated hereinto by reference.

Bus bars (not shown) connecting the lamps and the push switches are mounted to the back surface of the base. In addition, at the back surface of the base, the bus bars are such that connector terminals at the bus bar substrate (described below) of the present invention and connector terminals connected via lead wires are integrally formed.

Figure 2:
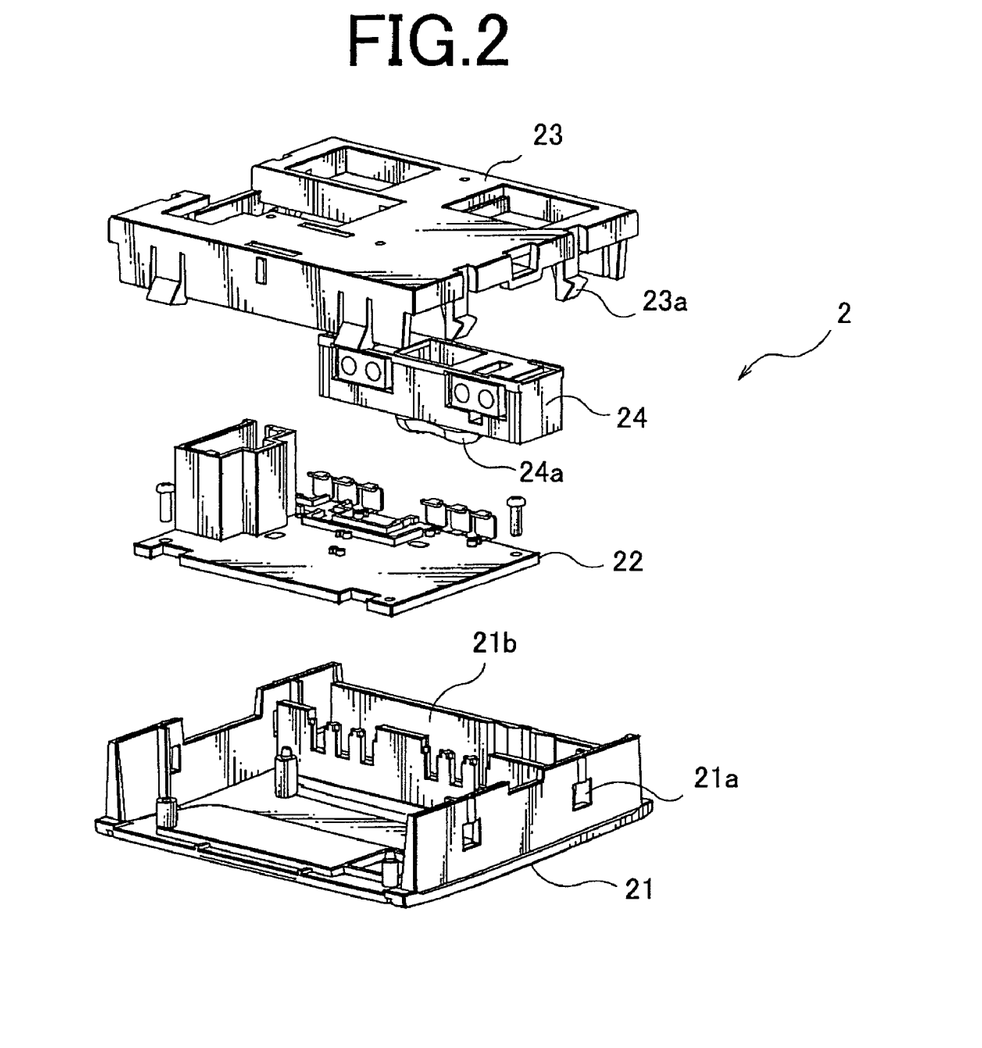
FIG. 2 is an exploded perspective view of the main portion of the vehicle interior light shown in FIG. 1.

An operation box 2 accommodated in the center chamber of the base 1 has the structure shown in FIG. 2. The operation box 2 comprises a front plate 21, a bus bar substrate 22 of the present invention screwed in the front plate 21, a back plate 23 integrated with the front plate 21 by engaging a pawl 23a with a hole 21a in the front plate 21 from the back side, and a movable contact member 24 accommodated in an accommodation portion 21b of the front plate 21 so as to be movable leftwards and rightwards in FIG. 2. A knob 24a of the movable contact member 24 protrudes from a slot 21c of the front plate 21.

Figure 3:
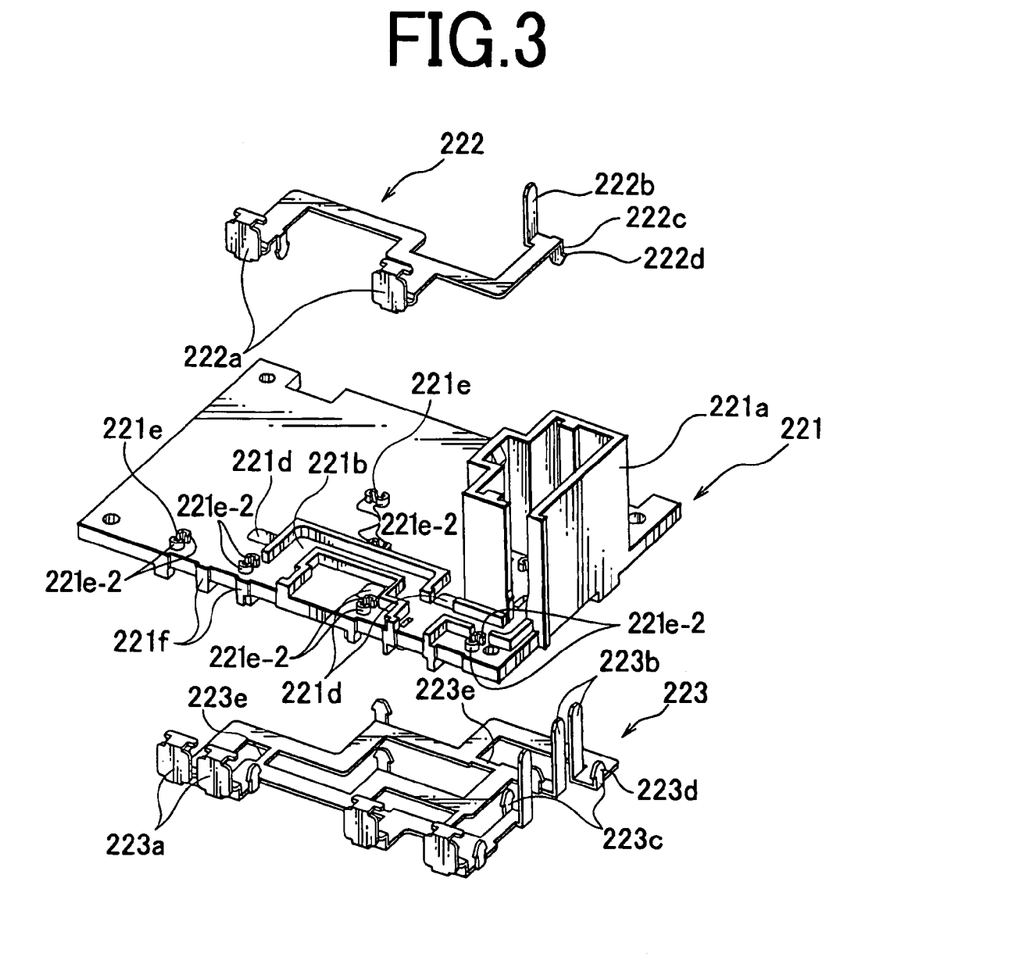
FIG. 3 is an exploded perspective view of the bus bar substrate in accordance with the present invention.
Figure 4:
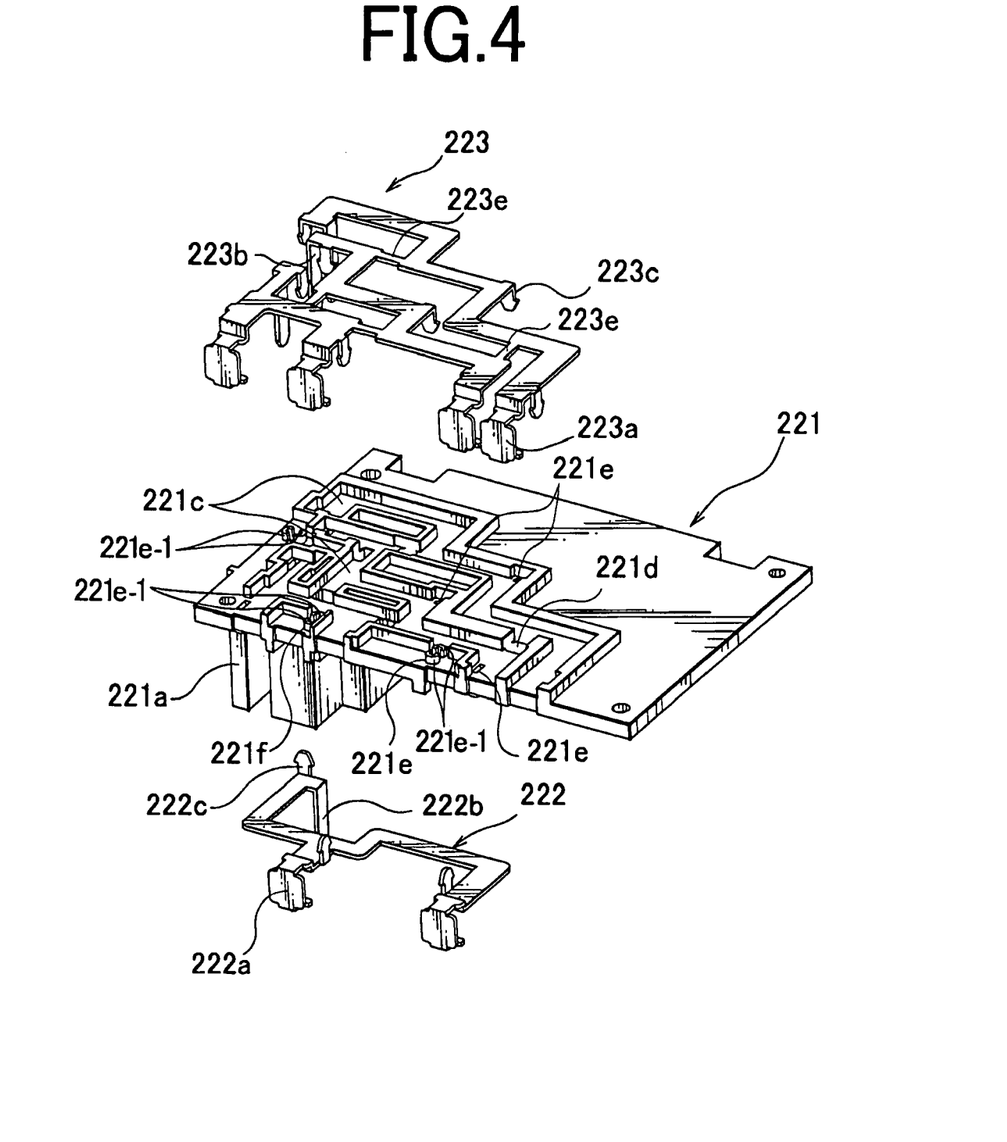
FIG. 4 is an exploded perspective back view of the bus bar substrate in accordance with the present invention.

The bus bar substrate 22 is illustrated in more detail in FIGS. 3 and 4. FIG. 3 is an exploded perspective view of the bus bar substrate 22 in the same plane and as seen from the opposite side from FIG. 2 in the horizontal direction. FIG. 4 is an exploded perspective back view of the bus bar substrate 22 shown in FIG. 3.

The bus bar substrate 22 comprises an insulating base plate 221 and a pair of bus bars 222 and 223 mounted to the front and back surfaces of the insulating base plate 221.

A connector box 221a, grooves 221b and 221c, small holes 221d, securing holes 221e, and separation protrusions 221f are formed at the insulating base plate 221. The connector box 221a comprises connectors. The grooves 221b and 221c guide the bus bars 222 and 223 (described later). The small holes 221d receive portions of divided bridges 223e (described later). The securing holes 221e receive stopper portions 222c and 223c (described later). The separation protrusions 221f prevent shorting between adjacent stationary contacts 222a and 223a disposed in parallel, and allows smooth sliding of the movable contact member 24.

The bus bar 222 comprises the stationary contacts 222a, a connector terminal 222b, and the stopper portion 222c. The stationary contacts 222a are stationary with respect to the movable contact member 24. The connector terminal 222b is accommodated in the connector box 221a. The stopper portion 222c is inserted in the securing hole 221e and is pushed into an inner wall 221e-1 projecting outwardly from the opposite surface of the insulating base plate 221 and defining the securing hole 221e so as not to become dislodged. An arrowhead-shaped bulge 222d is formed at an end of the stopper portion 222c.

The bus bar 223 is disposed opposite to the bus bar 222 with the insulating base plate 221 being disposed between the bus bars 222 and 223. Whereas the bus bar 222 is not divided into bus bar portions, the bus bar 223 is divided into three bus bar portions that are connected by the bridges 223e. Similarly to the bus bar 222, each portion of the bus bar 223 comprises a stationary contact 223a, a connector terminal 223b, and a stopper portion 223c having an arrowhead-shaped bulge 223d.

A method for incorporating the bus bars 222 and 223 in the front and back surfaces of the insulating base plate 221 will be described. While fitting the bus bar 222 to the groove 221b of the insulating base plate 221, the stopper portion 222c is inserted into the securing hole 221e, the connector terminal 222b is inserted into and secured to the connector box 221a, and base portions of the stationary contacts 222a are fitted along the separation protrusions 221f, so that the base bar 222 is secured to the insulating base plate 221.

Next, similarly, while the bus bar 223 is being fitted to the groove 221c formed in the opposite surface of the insulating base plate 221, the stopper portions 223c are inserted into the securing holes 221e and are pushed into an inner wall 221e-2 projecting outwardly from the surface of the insulating base plate 221 and defining the securing hole 221e so as not to become dislodged. The connector terminals 223b are inserted into and secured to the connector box 221a, and base portions of the stationary contacts 223a are fitted along the separation protrusions 221f. In such a manner, the bus bar 223 is secured to the insulating base plate 221.

Figure 7:
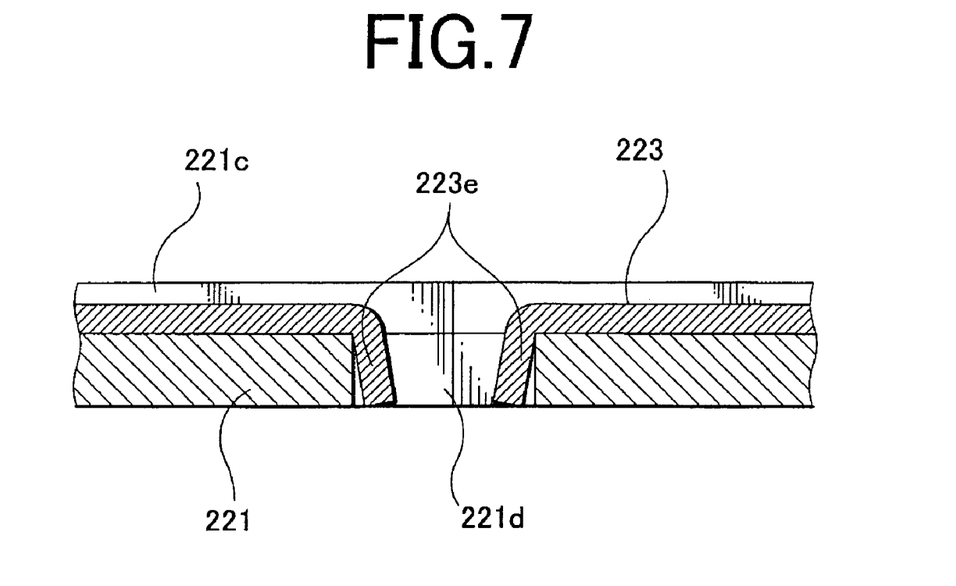
FIG. 7 is a sectional view showing a state in which a bridge of a bus bar is severed at a small hole.

For the base bar 223, three base bar portions are connected by the bridges 223e, so that the base bar portions do not form a circuit network. Therefore, it is necessary to sever the bridges 223e and form electrically separate portions. Accordingly, in the next step, a pin is secured at a location of a presser opposite to substantially the central portion of a bridge 223e, and the pin is pushed towards the bridge 223e, causing two severed portions to enter the small hole 221d disposed at the back side of the central position of the bridge 223e. As a result, the bus bar 223 is divided into individual bus bar portions, thereby forming the circuit network (see FIG. 7).

B. Second Embodiment

Figure 5:
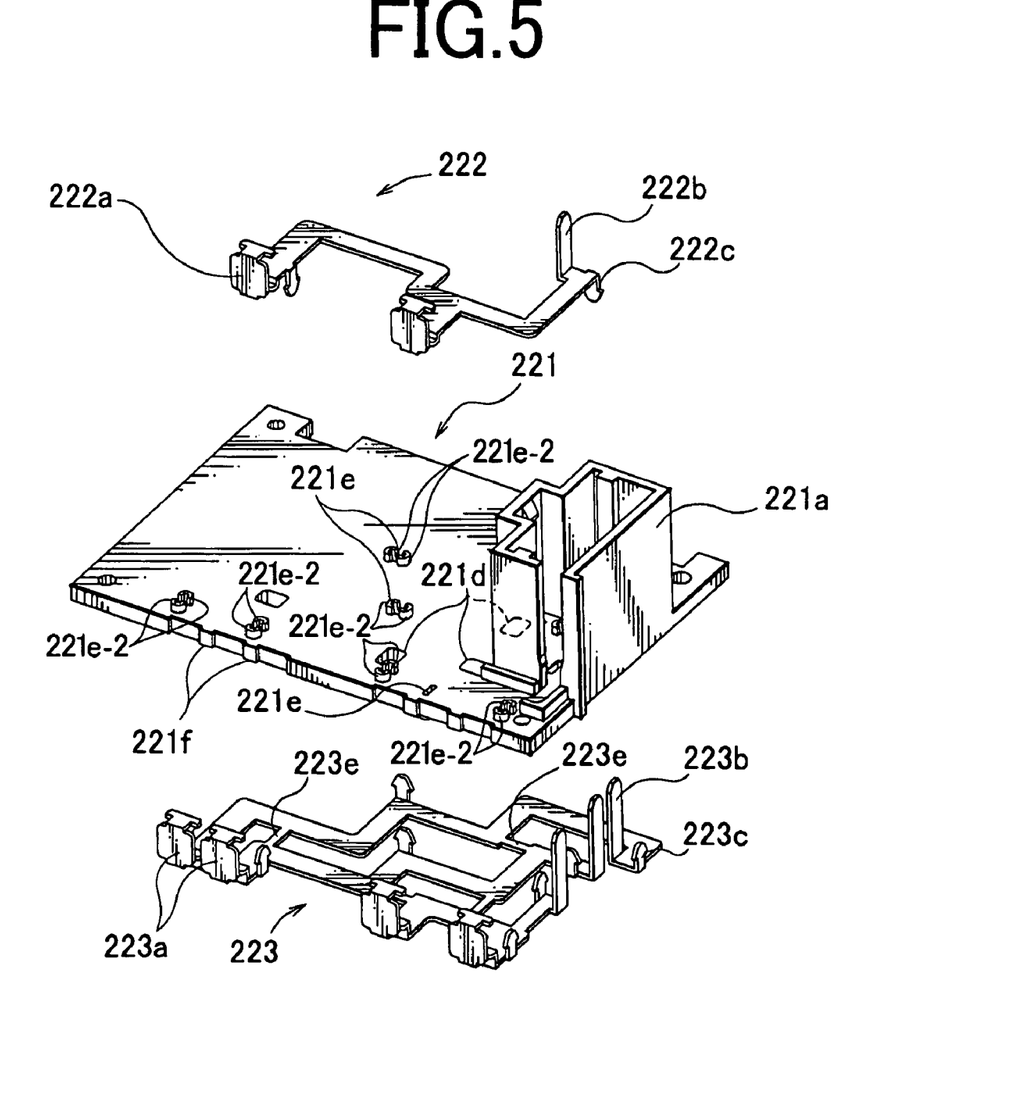
FIG. 5 is an exploded perspective view of a second embodiment of the present invention.
Figure 6:
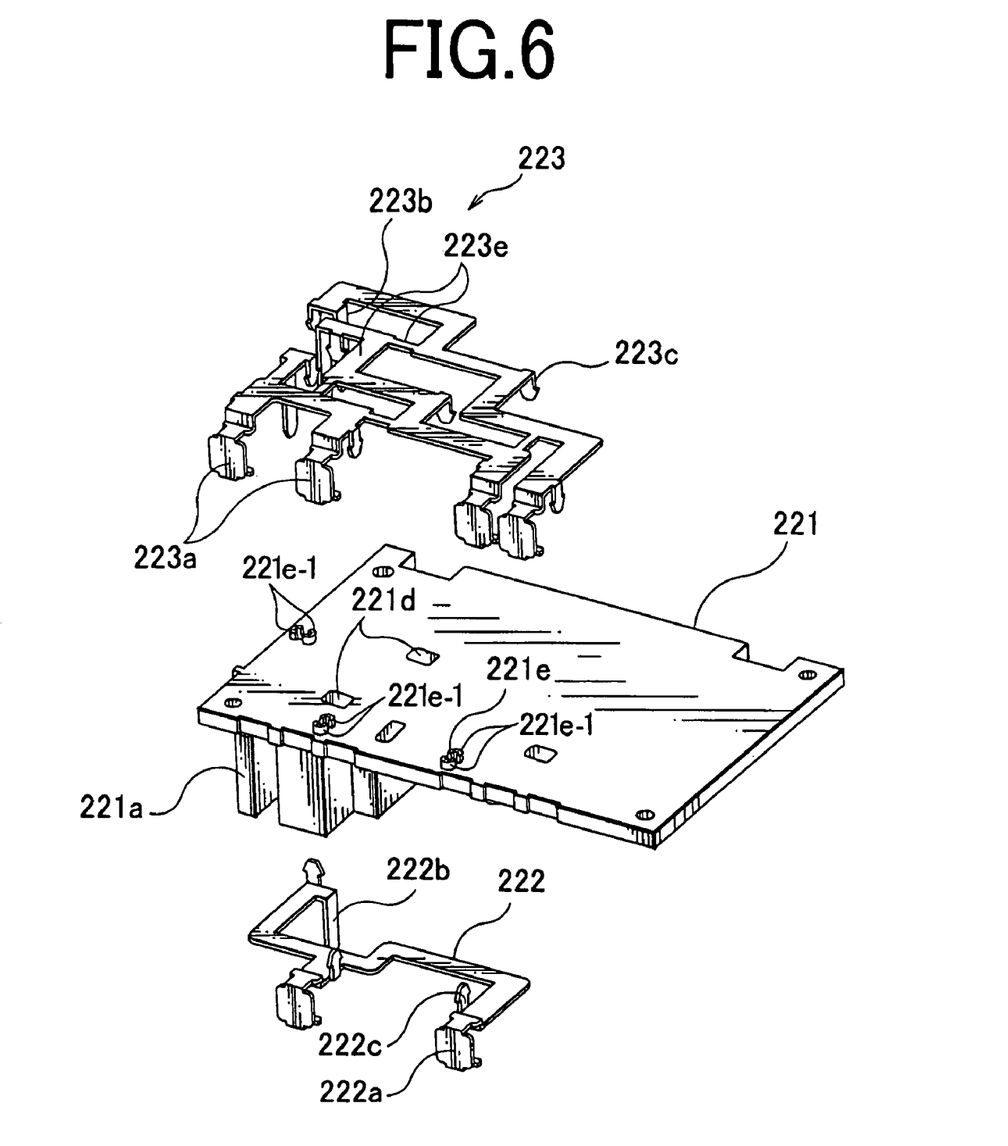
FIG. 6 is an exploded perspective back view of the second embodiment of the present invention shown in FIG. 5.

A second embodiment of the present invention will be described with reference to FIGS. 5 and 6.

As described above, in the first embodiment, the bus bars 222 and 223 are fitted to the grooves 221b and 221c in the front and back surfaces of the insulating base plate 221, and the stopper portions 222c and 223c are inserted into and secured to the securing holes 221e. In the second embodiment, bus bars 222 and 223 are secured to an insulating base plate 221 only by inserting stopper portions 222c and 223c into and securing them to securing holes 221e.

Arrowhead-shaped bulges 222d and 223d which are pushed into inner walls defining the securing holes 221d by being inserted into the securing holes 221d are formed at ends of the stopper portions 222c and 223c. Therefore, the bus bars 222 and 223 are not dislodged from the insulating base plate 221. Inserting the stopper portions 222c and 223c into the securing holes 221d causes the bus bars 222 and 223 to be positioned with respect to the insulating base plate 221.

As described above, according to the present invention, the bus bars 222 and 223 are disposed at the front and back surfaces of the insulating base plate 221 by fitting the bus bars 222 and 223 to the grooves 221b and 221c at the front and back surfaces of the insulating base plate 221 and inserting the stopper portions 222c and 223c into the securing holes 221d, or by only inserting the stopper portions 222c and 223c into the securing holes 221d. Therefore, even a sophisticated circuit network can be easily formed.

Figure 8:
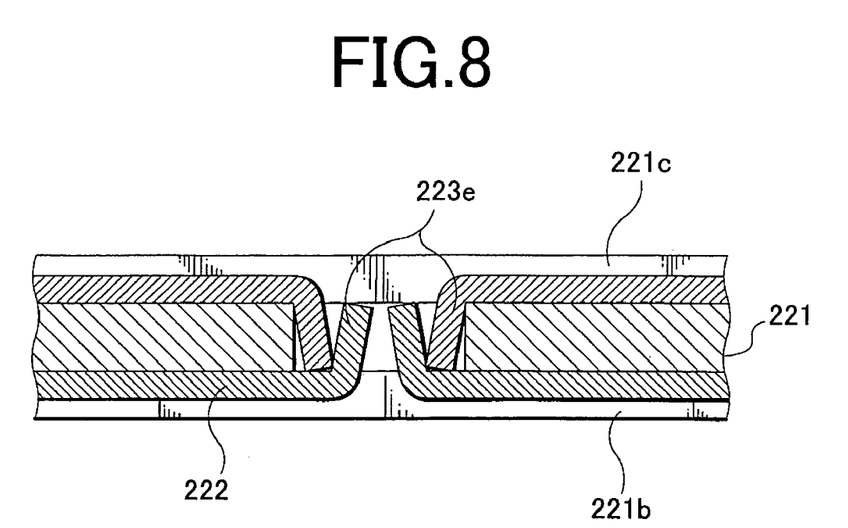
FIG. 8 is a sectional view showing a state in which bridges of bus bars on the front and back surfaces are severed and overlap in a small hole.

If bus bars that are disposed at the front and back surfaces of the insulating base plate 221 have structures like the bus bar 223 having portions connected by bridges, when the bridges are severed in the same small holes 221d from the front and back, the small severed portions of the bridges overlap in the small hole. Therefore, the bus bars at the front and back surfaces of the insulating base plate 221 are electrically connected. Consequently, the insulating base plate 221 can be used in the same way as generally used printed circuit boards, and the pattern design freedom is increased, thereby allowing the designing to be easily carried out. If the small severed portions of the bridges do not properly contact each other, they may be, for example, soldered in order to achieve proper contact.

What is claimed is:

1. A bus bar substrate for an interior light of a vehicle, the bus bar substrate comprising:

an insulating base plate having front and back surfaces and a plurality of front and back securing holes through the insulating base; and front and back bus bars respectively positioned on the front and back surfaces of the insulating base plate, wherein the front securing holes are surrounded by guard walls extending outwardly from the back surface of the insulating plate, and wherein the back securing holes are surrounded by guard walls extending outwardly from the front surface of the insulating plate, and wherein the front and back bus bars comprise front and back stopper portions inserted into respective ones of the front and back securing holes oppositely to one another so as to secure the front and back bus bars to the front and back surfaces of the insulating base plate.

2. The bus bar substrate for an interior light of a vehicle according to claim 1, wherein ends of the stopper portions of the front and back bus bars have bulges that are forcibly engaged with the guard walls respectively defining the front and back securing holes so as be immovably connected thereto.

3. The bus bar substrate for an interior light of a vehicle according to claim 1, wherein an end of a predetermined one of the bus bars inserted in both surfaces of the insulating base plate is lead out to a connector box of the insulating base plate so as to establish a connector terminal.

4. The bus bar substrate for an interior light of a vehicle according to claim 1, wherein the bus bars secured to the front and back surfaces of the insulating base plate include severed bridge portions to form an electrical circuit.

5. The bus bar substrate for an interior light of a vehicle according to claim 4, wherein the insulating base plate has small holes, and wherein at least pairs of the severed bridge portions of the bus bars secured to the front and back surfaces of the insulating base plate overlap at a respective same one of the small holes of the insulating base plate, and wherein the bus bars are electrically connected by the severed bridge portions being overlapped in the same one of the small holes.

* * * * *